United States Patent [19]

Zdebel et al.

[11] Patent Number: 5,108,946

[45] Date of Patent: * Apr. 28, 1992

[54] METHOD OF FORMING PLANAR ISOLATION REGIONS

[75] Inventors: Peter J. Zdebel, Mesa; Barbara Vasquez, Chandler; Hang M. Liaw; Christian A. Seelbach, both of Scottsdale, all of Ariz.

[73] Assignee: Motorola, Inc., Schaumberg, Ill.

[*] Notice: The portion of the term of this patent subsequent to Oct. 16, 2007 has been disclaimed.

[21] Appl. No.: 559,460

[22] Filed: Jul. 27, 1990

Related U.S. Application Data

[63] Continuation of Ser. No. 354,045, May 19, 1989, abandoned.

[51] Int. Cl.$^5$ .......................................... H01L 21/76
[52] U.S. Cl. .................................. 437/72; 437/90; 437/233; 437/967; 437/89
[58] Field of Search ............... 437/67, 238, 239, 240, 437/241, 78, 69, 81, 89, 90, 949, 72, 233, 967; 156/643

[56] References Cited

U.S. PATENT DOCUMENTS

| | | |
|---|---|---|
| 4,526,631 | 7/1985 | Silvestri et al. ............... 148/175 |
| 4,745,081 | 5/1988 | Beyer et al. .................... 437/78 |
| 4,786,615 | 11/1988 | Liaw et al. ..................... 437/89 |
| 4,786,960 | 11/1988 | Jeuch ............................ 357/42 |
| 4,963,506 | 10/1990 | Liaw et al. .................... 437/101 |
| 5,008,208 | 4/1991 | Liu et al. ....................... 437/89 |

FOREIGN PATENT DOCUMENTS

| | | | |
|---|---|---|---|
| 0172772 | 2/1986 | European Pat. Off. ........... 437/67 |
| 56-157044 | 12/1981 | Japan .................................. 437/67 |
| 59-204252 | 11/1984 | Japan .................................. 437/67 |
| 60-133739 | 7/1985 | Japan .................................. 437/67 |

OTHER PUBLICATIONS

Furumura et al., Selective Growth of Polysilicon, J. Electrochem. Soc.: Solidstate Science and Technology, v. 133, No. 2 (Feb. 1986), pp. 379-383.

*Primary Examiner*—Olik Chaudhuri
*Assistant Examiner*—G. Fourson
*Attorney, Agent, or Firm*—Harry Wolin

[57] ABSTRACT

A method of forming planar isolation regions in semiconductor structures includes providing a semiconductor substrate and forming a semiconductor layer thereon. A dielectric layer comprising at least two different dielectric materials is disposed on the semiconductor layer and a trench is etched therethrough and into the semiconductor layer. Dielectric sidewalls are formed in the trench which is then filled by selectively forming depositing polycrystalline silicon therein. The semiconductor material is then at least partially oxidized to form the planar isolation region. The isolation regions disclosed herein may be used for both intradevice and interdevice isolation.

21 Claims, 3 Drawing Sheets

METHOD OF FORMING PLANAR ISOLATION REGIONS

This application is a continuation of prior application Ser. No. 07/354,045 filed May 19, 1989 now abandoned.

BACKGROUND OF THE INVENTION

This invention relates, in general, to semiconductor devices, and more particularly to a method of forming planar isolation regions in semiconductor structures.

Presently, there are many methods of forming isolation regions in semiconductor structures. However, there are many shortcomings and disadvantages associated with conventional methods. For example, conventional recessed oxide isolation generally has a non-vertical isolation angle that is associated with increased oxide encroachment into the active device region. Further, conventional recessed oxide isolation methods generally have a large process variance.

U.S. Pat. No. 4,526,631 entitled "Method for Forming a Void Free Isolation Pattern Utilizing Etch and Refill Techniques" issued to Silvestri et al. on Jul. 2, 1985, discloses a prior art isolation technique. Following the etching of a trench, a first insulating layer is formed on the sidewalls of the trench. The trench is then partially filled with an epitaxial silicon. Since the top surface of the epitaxial silicon is faceted, a capping second insulating layer is used to fill the remainder of the trench and also to cover an area above the trench. Following the formation of the capping second insulating layer, a planarization etch back is performed.

Another prior art isolation region method is disclosed by Yu and Witkowski in an article entitled "New Bird's Beak-Free Device Isolation Technology", J. Electro-Chem. Soc.: Solid-State Science and Technology, October 1988, pages 2562-2566. Following the etching of a trench, hitride layers are formed on the sidewalls. Following this formation, a selective epitaxial silicon layer is grown in the field regions and is completely converted to thermal silicon dioxide film to form the field oxide. This disclosure claims the advantages of a uniform field oxide, no birds beak encroachment and no dislocations in active device areas. However, there are various process control issues associated with this disclosed method which make results hard to reproduce and also, the resulting isolation regions are nonplanar.

SUMMARY OF THE INVENTION

Accordingly, it is an object of the present invention to provide a method of forming planar isolation regions including non-encroaching vertical sidewalls.

It is an additional object of the present invention to provide a method of forming planar isolation regions that may be of varying depths and employed both as intradevice isolation and interdevice isolation.

Yet a further object of the present invention is to provide a method of forming planar isolation regions of variable width and further having good scalability.

The foregoing and other objects and advantages are achieved in the present invention by one embodiment in which, as a part thereof, includes providing a semiconductor substrate and forming a semiconductor layer thereon. Next, a dielectric layer is formed on the semiconductor layer and then a trench is etched through the dielectric layer and into the semiconductor layer. A trench liner layer is then formed on the sidewalls of the trench and the trench is filled by selectively forming polycrystalline silicon therein. The selectively formed polycrystalline silicon is then at least partially oxidized to form the planar isolation regions.

A more complete understanding of the present invention can be attained by considering the following detailed description in conjunction with the accompanying drawings.

DETAILED DESCRIPTION OF THE DRAWINGS

Figure 10:
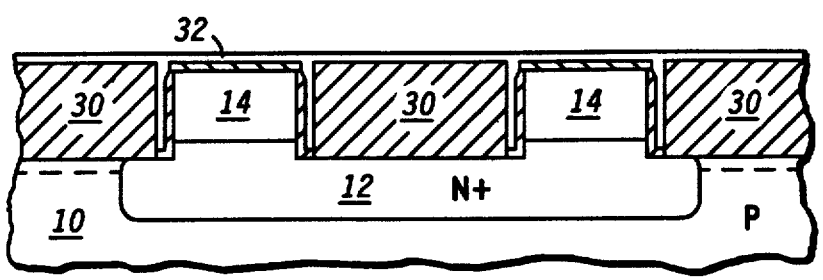
FIG. 10 is a highly enlarged cross-sectional view of a portion of a semiconductor structure having isolation regions.

FIGS. 1-9 are highly enlarged cross-sectional views of a portion of a semiconductor structure having planar intradevice and interdevice isolation regions during processing and FIG. 10 is a highly enlarged cross-sectional view of the finished structure. It should be understood that intradevice isolation regions separate active regions of a single device while interdevice isolation regions separate entire devices from each other. The isolation regions depicted by these figures are relatively shallow although isolation regions may be made deeper employing the present invention. Additionally, the present invention may be employed to create combinations of shallow and deep planar isolation regions.

Initially, a semiconductor substrate 10 is provided. Semiconductor substrates comprised of various materials may be employed with the present invention although a boron doped P-type silicon substrate having a <100> crystallographic orientation is employed in this embodiment. A buried layer 12 is then formed in substrate 10 by methods well known in the art. Buried layer 12 is of an N+ conductivity type in this embodiment. It should be understood that an optional channel stop may be implanted at this time although it is not shown in this embodiment.

An epitaxial silicon layer 14 is then formed on substrate 10 and buried layer 12. However it should be understood that the present invention may also be employed without epitaxial silicon layer 14. A thermal oxide layer 16 is then formed on epitaxial silicon layer 14 or directly on substrate 10 and buried layer 12 if no epitaxial silicon layer is employed and a nitride layer 18 is then deposited on thermal oxide layer 16. Although nitride layer 18 may be formed by many methods well known in the art, LPCVD is employed in this embodiment. Nitride layer 18 is followed by the formation of oxide layer 20 which is formed by PECVD in this embodiment. It should be understood that thermal oxide layer 16, nitride layer 18 and oxide layer 20 form a hard mask for a shallow silicon trench etch and seal of the active area for subsequent refill oxidation.

Following the formation of oxide layer 20, one or more trenches 22 are etched into the structure. In this embodiment, a single mask isolation photolithography step is used and all the process dimensional bias and variability is confined to the photolithograpy. The etch in this embodiment is performed by initially etching through oxide layer 20, nitride layer 18 and thermal oxide layer 16 and stopping on epitaxial silicon layer 14.

Overetch at this point is not critical. A shallow silicon trench etch employing RIE is then performed to etch into epitaxial silicon layer 14.

Following the formation of trenches 22, a thermal oxide layer 24 is then formed on the sidewalls and bottom of each trench 22. This is followed by the deposition of a conformal nitride spacer layer 26 on the surface of the structure including in trenches 22. Conformal nitride spacer layer 26 may be formed by many methods well known in the art although LPCVD and PECVD are preferred. To ensure a good seal between conformal nitride spacer layer 26 and nitride layer 18, a prenitride clean with a brief wet oxide etch is included to remove any oxidized nitride from the exposed vertical surfaces of nitride layer 18.

Figure 1:
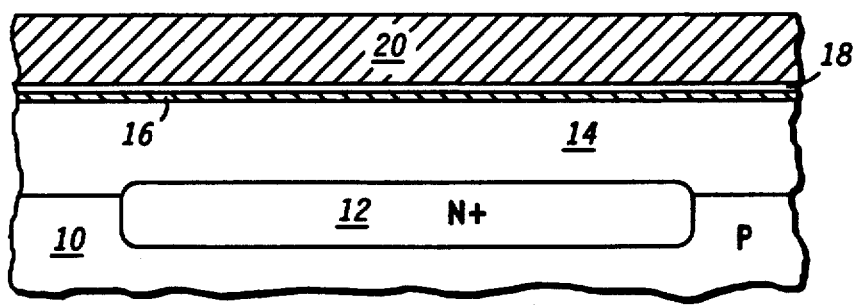
FIGS. 1-9 are highly enlarged cross-sectional views of a portion of a semiconductor structure having isolation regions during processing.
Figure 2:
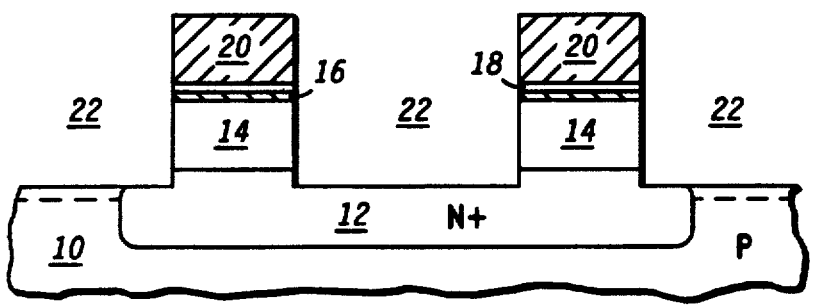
Figure 3:
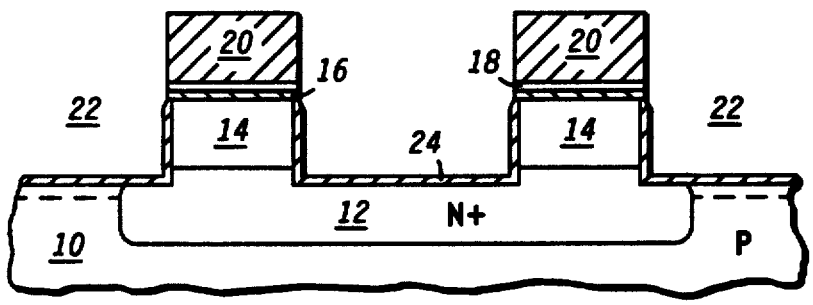
Figure 4:
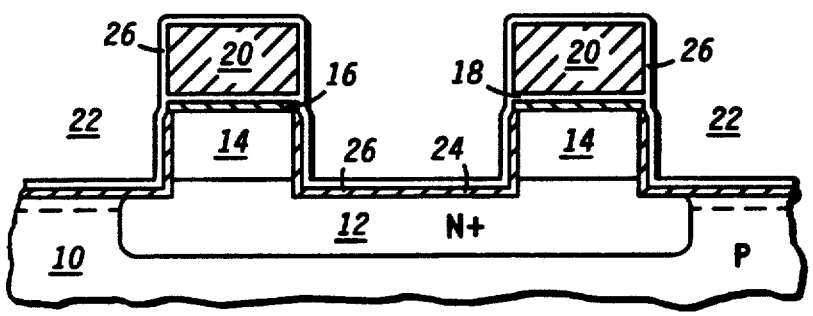
Figure 5:
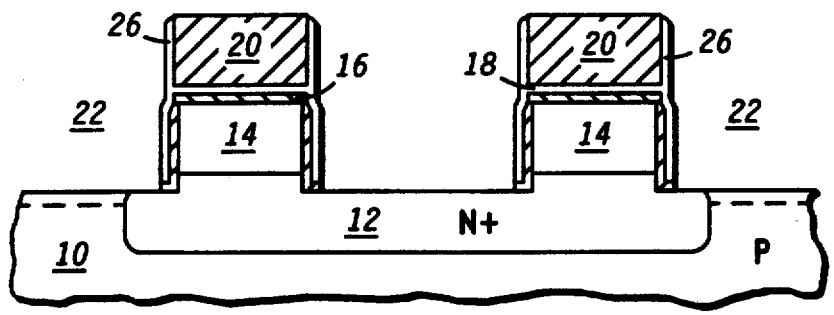

In FIG. 5, thermal oxide layer 24 and conformal nitride spacer layer 26 are anisotropically etched away excepting that disposed on the sidewalls of trenches 22. This etch exposes silicon in the bottoms of trenches 22. A two-part etch is employed in this process. Initially, an anisotropic etch is used to etch conformal nitride spacer layer 26. It is important that the portion of conformal nitride spacer layer 26 remaining on the sidewalls of trenches 22 extends above the interface of nitride layer 18 and oxide layer 20 to seal the device island during subsequent oxidations. This initial etch of conformal nitride spacer layer 26 is followed by a wet etch of the exposed portions of thermal oxide layer 24 on the bottom of each trench 22.

Figure 6:
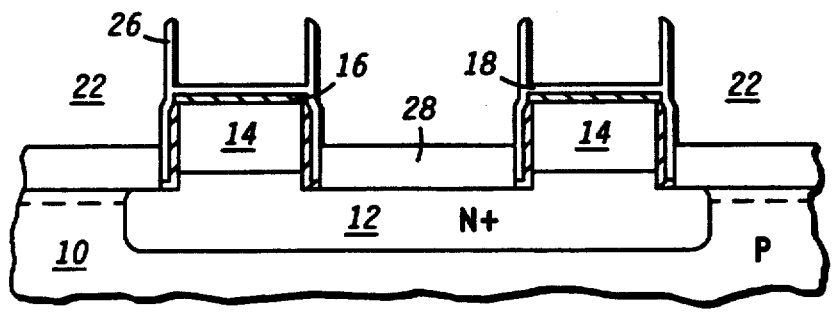

Once silicon has been exposed in the bottom of each trench 22, polycrystalline silicon 28 is selectively formed thereon partially filling each trench 22 as shown in FIG. 6. The amount of polycrystalline silicon 28 formed in each trench 22 is determined by the thickness of the oxide to be formed thereon. In any event, it is desirable that the final filled trench surface be planar with the surface of epitaxial silicon wafer 14. It is recommended that the selective formation of polycrystalline silicon 28 be performed by the method disclosed by U.S. Pat. No. 4,963,506 issued to Liaw et.al. on Oct. 16, 1990 and entitled "Selective Deposition of Amorphous and Polycrystalline Silicon". It should be noted that polycrystalline silicon 28 grown in the manner disclosed in the copending application will have a planar top surface thereby allowing for planar trench fill.

The method disclosed by Liaw et al. includes the chemical vapor deposition of polycrystalline silicon by reacting a silicon containing gas such as a silane with a halogen containing gas such as hydrogen chloride in a hydrogen atmosphere. The hydrogen decreases the reaction rate of the silane reducing into its component parts while the hydrogen chloride breaks silicon-non-silicon bonds but leaves silicon-silicon bonds in tact. This results in a highly selective deposition. Further, this method requires lower temperatures than does the formation of epitaxial silicon and allows for a device to be fabricated at generally lower temperatures.

Figure 7:
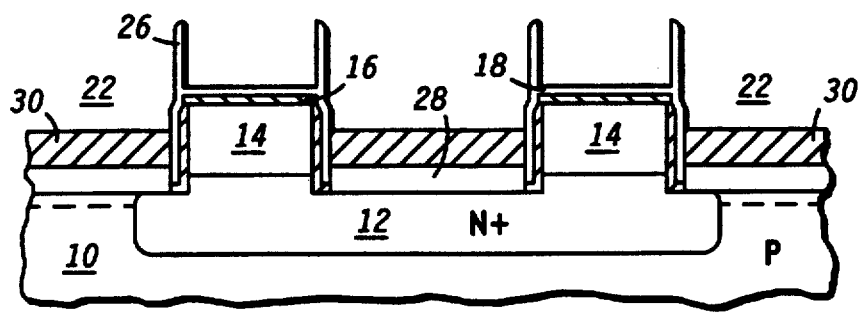
Figure 8:
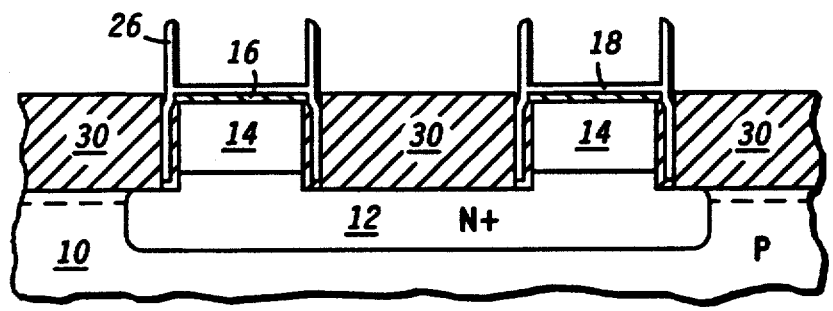
Figure 9:
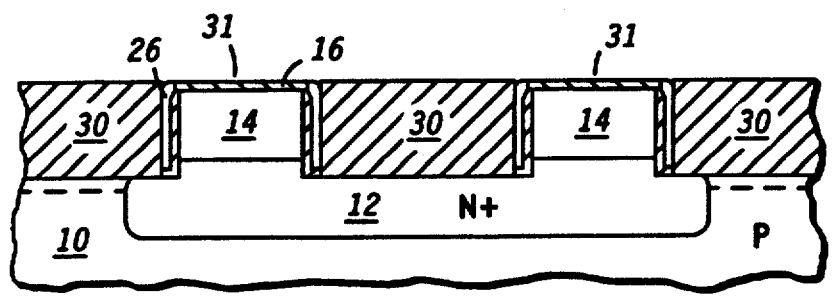

Following the selective formation of polycrystalline silicon 28, a wet etch is used to remove the remainder of oxide layer 20 which is disposed on nitride layer 18. It should be understood that an oxide etch with good nitride selectivity must be employed. Once polycrystalline silicon 28 has been selectively deposited and oxide layer 20 has been etched away so that a planar surface may be more easily formed, polycrystalline silicon layer 28 is oxidized partially as shown in FIG. 7 or fully as shown in FIG. 8, to form silicon dioxide isolation regions 30 that are coplanar with epitaxial silicon layer 14.

One of skill in the art will understand that polycrystalline silicon thermally oxidizes much faster than epitaxial silicon in and therefore the present invention is superior to prior art employing epitaxial silicon in that it requires less time to fabricate a device. Once polycrystalline silicon 28 has been oxidized a predetermined amount, a wet etch is employed to remove nitride layer 18 and thermal oxide layer 16 thereby exposing the active device islands 31. This may be followed by the formation of additional thermal oxide and/or nitride on the structure such as cap layer 32 which comprises thermal oxide and LPCVD nitride in this embodiment.

Figure 11:
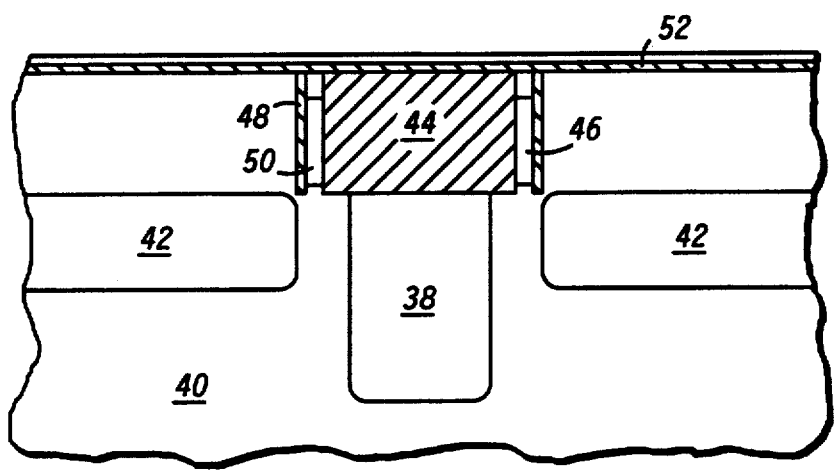
FIGS. 11-13 are highly enlarged cross-sectional views of various embodiments of the present invention.
Figure 12:
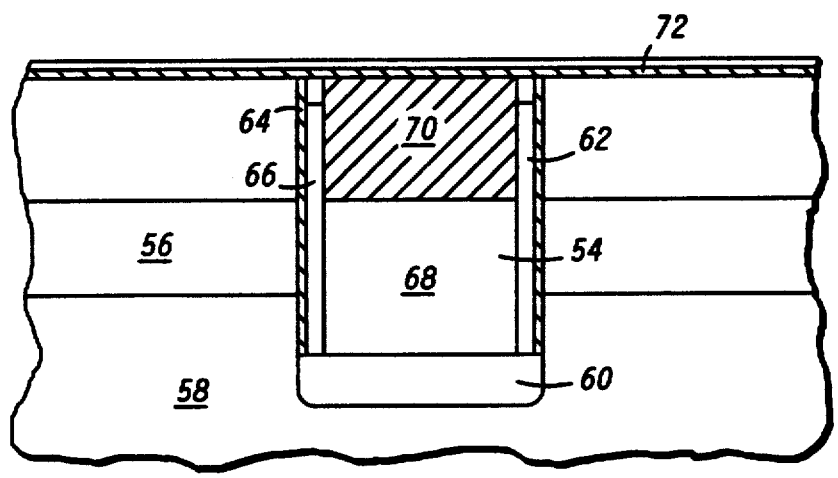
Figure 13:
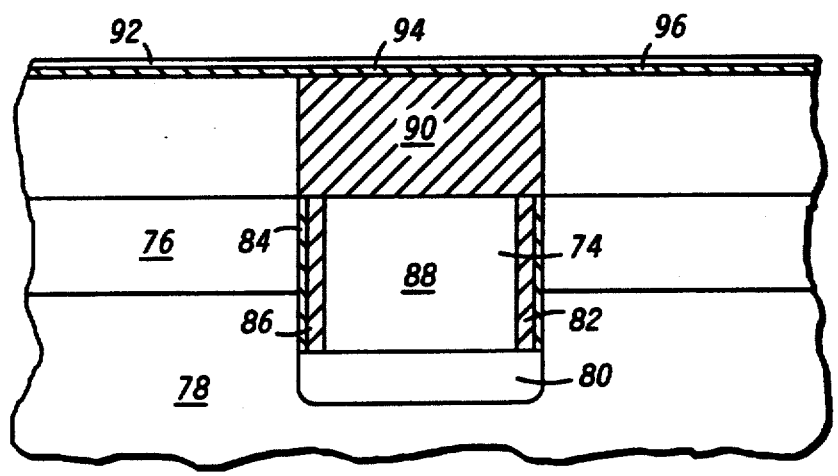

FIGS. 11-13 are highly enlarged cross-sectional views of various embodiments of the present invention. The embodiment depicted in FIG. 11 is similar to those disclosed above except that it depicts shallow interdevice isolation having a channel stop. Channel stop 38 is implanted into the substrate 40 between two buried layers 42. The oxide isolation region 44 is thermally oxidized selective polysilicon refill and is formed in the same manner as disclosed above. The sidewall liners 46 are comprised of an oxide layer 48 and a nitride layer 50 additionally a cap layer 52 comprising thermal oxide and LPCVD nitride is disposed on the structure. Again, the selective polysilicon refill allows for a planar structure.

The embodiment depicted in FIG. 12 includes a deep trench 54 extending through the buried layer 56 and into substrate 58. Beneath trench 54, a channel stop 60 has been implanted into substrate 58. The sidewall liner 62 comprises an oxide layer 64 and a nitride layer 66. The selectively deposited polycrystalline silicon 68 has been only partially oxidized in this embodiment resulting in planar oxidized isolation region 70. Again, a cap layer 72 is disposed on the structure.

The embodiment depicted by FIG. 13 discloses a deep trench 74 that extends through the buried layer 76 into substrate 78. A channel stop 80 has been implanted beneath trench 74. Sidewall liners 82 are comprised of oxide. In this embodiment, sidewall liner 82 includes a thermal oxide layer 84 and a CVD oxide layer 86. No nitride is necessary for sidewall liner 82 because no polycrystalline silicon is thermally oxidized. Trench 74 has been partially filled with polycrystalline silicon 88 using the selective deposition technique mentioned above. The remainder of trench 74 has been filled with deposited oxide 90. A cap layer 92 has been disposed on the structure. Cap layer 92 comprises a thermal oxide layer 94 and a nitride layer 96.

In addition to the present invention serving strictly as isolation trenches, it should be understood that frontside contact may be made to the substrate through the trenches disclosed above. Further, the polycrystalline silicon allows for higher diffusivity in the column than does epitaxial silicon and therefore lower temperatures and less time are required to dope a polycrystalline silicon column. Additionally, although the embodiments depicted herein show buried layers generally associated with a bipolar device, it should be understood that wells may be easily employed and that the present invention may be used in conjunction with MOS devices.

Thus it is apparent that there has been provided, in accordance with the invention, an improved method of forming planar isolation regions in semiconductor structures which meets the objects and advantages set forth above. While specific embodiments of the invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of this invention.

What is claimed is:

1. A method of forming planar isolation regions in semiconductor structures comprising the steps of:
   providing a semiconductor substrate;
   forming a semiconductor layer on said substrate;
   forming a dielectric layer on said semiconductor layer, said dielectric layer comprising at least one layer of a first dielectric material and at least one layer of a second dielectric material;
   patterning and etching a trench through said dielectric layer and into said semiconductor layer;
   forming a trench liner layer in said trench, said trench liner layer being comprised of the first dielectric material;
   removing said trench liner layer excepting that disposed on the sidewalls of said trench;
   selectively forming polycrystalline silicon in said trench, said polycrystalline silicon being formed in CVD reactor by reacting a silicon containing gas and a halogen containing gas in a hydrogen atmosphere, neither of said gases containing carbon; and
   oxidizing at least a portion of said polycrystalline silicon in said trench.

2. The method of claim 1 wherein the semiconductor substrate comprises doped silicon, the semiconductor layer comprises silicon, the first dielectric material comprises an oxide and the second dielectric material comprises a nitride.

3. The method of claim 2 wherein the forming a trench liner step includes forming a layer of the second dielectric material in the trench and on the first dielectric material.

4. The method of claim 2 further including the formation of a channel stop beneath the trench.

5. The method of claim 2 further including the formation of a buried layer for a bipolar device.

6. The method of claim 2 wherein the patterning and etching step includes etching the trench through the semiconductor layer and into the substrate.

7. The method of claim 2 wherein frontside contact is made to the substrate through the isolation trench.

8. A method of forming planar isolation regions in semiconductor structures comprising the steps of:
   providing a semiconductor substrate;
   forming a dielectric layer on said semiconductor substrate, said dielectric layer comprising at least one layer of a first dielectric material and at least one layer of a second dielectric material;
   patterning and etching a trench through said dielectric layer and into said semiconductor substrate;
   forming a trench liner layer in said trench, said trench liner layer being comprised of the first dielectric material;
   removing said trench liner layer excepting that disposed on the sidewalls of said trench;
   selectively forming polycrystalline silicon in said trench, said polycrystalline silicon being formed in a CVD reactor by reacting a silicon containing gas and a halogen containing gas in a hydrogen atmosphere, neither of said gases containing carbon; and
   oxidizing at least a portion of said polycrystalline silicon in said trench.

9. The method of claim 8 wherein the semiconductor substrate comprises doped silicon, the first dielectric material comprises an oxide and the second dielectric material comprises a nitride.

10. The method of claim 9 wherein the forming a trench liner step includes forming a layer of the second dielectric material in the trench and on the first dielectric material.

11. The method of claim 9 further including the formation of a channel stop beneath the trench.

12. The method of claim 9 further including the formation of a buried layer in the substrate for a bipolar device.

13. The method of claim 9 wherein frontside contact is made to the substrate through the isolation trench.

14. A method of forming isolation regions in semiconductor structures comprising the steps of;
    providing a silicon substrate;
    forming an epitaxial silicon layer on said substrate;
    forming a dielectric layer on said epitaxial silicon layer, said dielectric layer comprising a thermal oxide layer, a nitride layer disposed on said thermal oxide layer and another oxide layer disposed on said nitride layer;
    patterning and etching a trench through said dielectric layer and into said epitaxial silicon layer;
    forming a trench liner layer of oxide in said trench;
    forming a conformal layer of nitride on the substrate including in said trench;
    removing said conformal layer and said trench liner layer excepting that disposed on the sidewalls of said trench;
    selectively growing polycrystalline silicon in said trench, said polycrystalline silicon being grown in a CVD reactor by reacting a silicon containing gas and halogen containing gas in a hydrogen atmosphere, neither of said gases containing carbon;
    removing the top oxide layer of said dielectric layer; and
    oxidizing at least a portion of said polycrystalline silicon in said trench.

15. The method of claim 14 further including the formation of a channel stop beneath the trench.

16. The method of claim 14 including the formation of a buried layer in the substrate for a bipolar device.

17. The method of claim 14 wherein the patterning and etching step includes etching the trench through the epitaxial silicon layer and into the substrate.

18. The method of claim 14 wherein frontside contact is made to the substrate through the isolation trench.

19. The method of claim 2 further including the formation of a well in the substrate for an MOS device.

20. The method of claim 9 further including the formation of a well in the substrate for an MOS device.

21. The method of claim 14 further including the formation of a well in the substrate for an MOS device.

* * * * *

UNITED STATES PATENT AND TRADEMARK OFFICE
CERTIFICATE OF CORRECTION

PATENT NO. : 5,108,946

DATED : April 28, 1992

INVENTOR(S) : Peter J. Zdebel et al

It is certified that error appears in the above-identified patent and that said Letters Patent is hereby corrected as shown below:

Claim 16, column 6, line 50, after "14" insert --further--.

Signed and Sealed this

Twenty-third Day of November, 1993

Attest:

BRUCE LEHMAN

Attesting Officer

Commissioner of Patents and Trademarks